United States Patent [19]

Matsuzuka

[11] 4,232,191
[45] Nov. 4, 1980

[54] FM RECEIVING DEVICE
[75] Inventor: Takeshi Matsuzuka, Tokyo, Japan
[73] Assignee: Trio Kabushiki Kaisha, Tokyo, Japan
[21] Appl. No.: 878,797
[22] Filed: Feb. 17, 1978
[30] Foreign Application Priority Data
Feb. 23, 1977 [JP] Japan .................................. 52-21222
[51] Int. Cl.² .......................... H04H 5/00; H03D 7/16
[52] U.S. Cl. ................................ 179/1 GD; 455/207;
455/209; 455/316
[58] Field of Search ............... 179/15 BT, 1 G, 1 GB,
179/1 GC, 1 C, 1 D, 1 E, 1 GD, 1 GE;
325/344, 345, 346, 418, 419, 421, 422, 431, 432,
433, 452, 453, 454; 329/150, 153, 154, 122

[56] References Cited
U.S. PATENT DOCUMENTS

| 2,272,401 | 2/1942 | Chaffee ................................. 325/345 |
| 2,282,834 | 5/1942 | Thomas ................................ 325/346 |
| 3,257,511 | 6/1966 | Adler et al. ........................ 179/1 GE |
| 3,742,361 | 6/1973 | Wason ................................. 325/433 |
| 3,909,735 | 9/1975 | Anderson et al. ................... 325/346 |
| 3,965,423 | 6/1976 | Fish, Jr. et al. ..................... 325/346 |
| 4,092,602 | 5/1978 | Nishioka et al. ................. 179/1 GD |
| 4,142,158 | 2/1979 | Belisomi ............................. 325/452 |

Primary Examiner—Benedict V. Safourek
Attorney, Agent, or Firm—Gerald J. Ferguson, Jr.;
Joseph J. Baker

[57] ABSTRACT

A double super heterodyne FM receiver having a first local oscillator for deriving a first intermediate frequency signal from an FM input signal, tuning means for varying the frequency of the first local oscillator to tune the FM receiver to a predetermined frequency, a second local oscillator for deriving a second intermediate frequency signal from the first intermediate frequency signal, an FM detector for demodulating the second intermediate frequency and means for processing the demodulated signal, means for deriving the direct current component of an output signal occurring at a point after the FM detector, first control means for controlling the frequency of the second oscillator in response to the direct current component so that the direct current component is reduced to substantially zero to thereby lessen shock noise during the tuning of the receiver, second control means responsive to the tuning means being operated to tune the FM receiver so that the control means controls the means for deriving the direct current component to thereby derive a first low frequency range as the direct current component, the control means also being responsive to the tuning means no longer being operated so that a second low frequency range less than the first low frequency range is derived as the direct current component. The receiver may also include a stereo demodulator whereby shock noise and accordingly multi-stage coupling capacitance in the output stages may be eliminated by feeding the direct current component back from a point after the stereo demodulator to control the frequency of the second oscillator.

11 Claims, 2 Drawing Figures

FM RECEIVING DEVICE

BACKGROUND OF THE INVENTION

1. Field of the Invention

The invention relates to an FM receiver which receives FM broadcast waves for listening to FM broadcasts.

2. Discussion of the Prior Art

Such FM receivers carry out frequency-voltage conversion at the FM detection stage. Accordingly, direct current voltage develops in the FM detection stage output during tuning and detuning. This appears as shock noise.

Thus, multistage coupling condensers for prevention of direct current are incorporated in the audio signal circuit, such as in the output amplifiers or stereo demodulators, which is the next stage of the FM detection stage. However, shock noise cannot be completely eliminated since low range frequencies are reproduced. Other problems include deterioration in tone quality and in reliability, etc. due to the incorporation of multistage coupling condensers.

In addition, direct current voltage also develops in the audio signal circuit, which necessitates the multistage coupling condenser.

SUMMARY OF THE INVENTION

The objective of this invention is to provide an FM receiver in which shock noise can be completely eliminated and in which the multistage coupling condenser can be removed.

DETAILED DESCRIPTION OF THE PREFERRED EMBODIMENTS OF THE INVENTION

Figure 1:
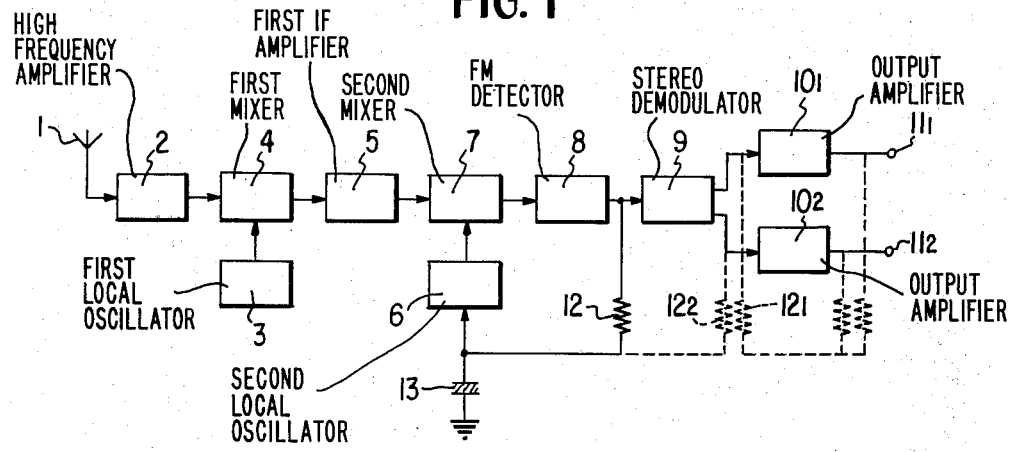
FIG. 1 is a circuit structural diagram illustrating one example of the FM receiver of this invention.

A description of the invention follows with reference to the figures. FIG. 1 illustrates the circuit structure of the FM receiver. In the figure, 1 is the antenna which receives FM broadcast waves. The FM broadcast wave (FM broadcast signal) received by this antenna 1 is amplified by the high frequency amplifier 2. This signal together with the output signal from the first local oscillator 3 are sent to the first mixer 4, where they are converted into the first intermediate frequency signal. This first intermediate frequency signal is then amplified by the first intermediate frequency amplifier 5' and then sent to the second mixer 7 with the output signal from the second local oscillator 6, where they are converted into the second intermediate frequency signal. This second intermediate frequency signal is then sent to the FM detector 8, and the FM detected output is then sent to the stereo demodulator 9, where it is separated into left and right signals. These separated signals are amplified at output amplifiers $10_1$, $10_2$, and brought to the output terminals $11_1$, $11_2$.

The above is a description of the main constituent elements of the FM receiver. The receiver has a double conversion super heterodyne structure, but this FM receiver also has the following structure. Specifically, only the direct current component is selected from the output of the FM detector 8 by resistor 12 and condenser 13. This direct current component is fed back to said second local oscillator 6. The oscillation frequency of this second local oscillator 6 is controlled by the direct current component which was fed back.

In this structure, when direct current voltage develops in the output of the FM detector 8 during tuning and, more precisely, in the vicinity of the correct tuning point of an FM station, this direct current voltage is fed back to the second local oscillator 6. The oscillation frequency of the second local oscillator 6 is controlled by the feed back direct current voltage so that the direct current voltage becomes substantially zero in the output of the FM detector 8 which carries out frequency-voltage conversion. This feed back control takes place in an instant. Thus, the formation of direct current voltage is substantially prevented in the output of the FM detector 8 by the direct current voltage feed back loop.

If this feed back control were employed in a single conversion super heterodyne structure, there occurs a defect in that the apparent reception range becomes broader due to the tendency to keep the correct tuning point when an FM station is tuned. However, the FM receiver in question has a double conversion super heterodyne structure so that such problems do not develop when feed back control is exercised. DC voltage is fed back to second local oscillator 6 and not to first local oscillator 3 by which the reception range is determined, so the above mentioned defect does not occur. Synthesizer tuners have come out recently, and since they may also employ the double conversion structure, said feed back control may be employed in them also.

Figure 2:
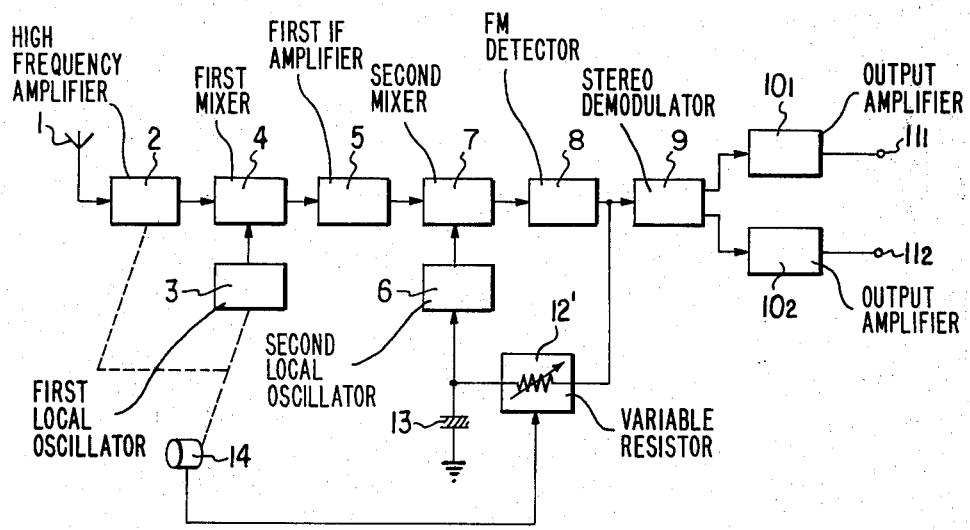
FIG. 2 is a circuit structural diagram illustrating another example of this invention.

When feed back control is exercised, frequency characteristics of the signal system may fall due to the resistor 12 and the condenser 13. Accordingly, when the frequency characteristics are to be prolonged, a variable resistor 12' may be employed, as seen in the other example in FIG. 2, along with a touch switch tuning knob 14. When the tuning knob 14 is touched, the value of the variable resistor 12' is reduced and low range frequencies are fed back as direct current component. When the tuning knob 14 is released, the value of the variable resistor 12' increases and only the ultra-low range frequencies are fed back as direct current component. The same effect is achieved if the capacity of the condenser 13 is switched instead of switching the value of the resistor. In the case of a synthesizer tuner, the switching signal of the value of the variable resistor 12' or the capacity of the condenser 13 may be derived from the station selection switch.

In the above explanation, the prevention of direct current voltage in the FM detector 8 output was conducted during tuning and detuning, but direct current voltage can develop in the stereo demodulator 9, which is the second level of the FM detector 8, or in the output amplifiers $10_1$, $10_2$. In such cases, resistors $12_1$, $12_2$ are connected to the output of the stereo demodulator 9 or to the output of the output amplifier $10_1$, $10_2$, as shown in the broken line in FIG. 1. The development of direct current voltage can be prevented by feed back of the direct current component from the output of the stereo demodulator 9 or the output of the output amplifier $10_1$, $10_2$. In the case of feed back of the direct current component after the signals have been separated into left and right signals, the direct current component of the sum of the left and right signals may be fed back, or the direct current component of only the left or the right signal may be fed back.

Accordingly, this FM receiver can prevent the development of direct current voltage in the output of the FM detector 8 during tuning or detuning, and thus eliminate shock noise. In addition, the development of direct current voltage can be prevented in the audio signal output of the stereo demodulator 9 and the output amplifier $10_1$, $10_2$. The use of a multistage coupling condenser can be eliminated from the audio signal circuit. Tonal quality and reliability are improved by the elimination of the coupling condenser and the audio signal circuit is simplified.

I claim:

1. A double super heterodyne, stereo FM receiver comprising
    a first local oscillator;
    a first mixer responsive to an FM stereo input signal and the output from said first local oscillator for deriving a first intermediate frequency signal;
    a second local oscillator;
    a second mixer responsive to said first intermediate frequency signal and the output from said second local oscillator for deriving a second intermediate frequency signal;
    an FM detector for demodulating the second intermediate frequency signal;
    a stereo demodulator DC coupled to said FM detector and responsive to the demodulated output signal from said FM detector for deriving left and right audio signals, said stereo demodulator being capable of passing a DC component from the FM detector: and
    means for controlling the frequency of said second local oscillator in response to said DC component taken from a point after said stereo demodulator so that the DC component is reduced to substantially zero to thereby lessen shock noise during tuning of the receiver.

2. A receiver as in claim 1 including output amplifiers DC coupled to said stereo amplifier for respectively amplifying said left and right audio signals.

3. A receiver as in claim 2 where said DC component is at least one of the output signals from said first and second output amplifiers.

4. In a receiver as in claim 3 where said DC component is both said output signals from said first and second output amplifiers.

5. A receiver as in claim 1 where said DC component is at least one of said right and left audio signals.

6. A receiver as in claim 5 where said DC component is both of said right and left audio signals.

7. A receiver as in claim 1 where said DC component is the sum of said left and right audio signals.

8. A double super heterodyne FM receiver comprising
    a first local oscillator;
    a first mixer responsive to an FM input signal and the output from said first local oscillator for deriving a first intermediate frequency signal;
    tuning means for varying the frequency of said first local oscillator to tune said FM receiver to a predetermined frequency;
    a second local oscillator;
    a second mixer responsive to said first intermediate frequency signal and the output of said second local oscillator for deriving a second intermediate frequency signal;
    an FM detector for demodulating the second intermediate frequency;
    means for processing the demodulated signal;
    means for deriving a direct current component of an output signal occurring at a point after said FM detector, said direct current component having at least a predetermined frequency range extending from substantially zero frequency;
    control means for controlling the frequency of said second oscillator in response to said direct current component so that the direct current component is reduced to substantially zero to thereby lessen shock noise during the tuning of the receiver said control means being responsive to said tuning means being operated to tune said FM receiver so that said means for deriving the direct current component derives said predetermined frequency range as said direct current component, said control means also being responsive to the tuning means not being operated so that a frequency range less than said predetermined frequency range is derived as said direct current component.

9. A receiver as in claim 8 where said means for deriving the direct current component comprises a resistor and capacitor in circuit where the direct current component is taken from the capacitor.

10. A receiver as in claim 9 where the receiver includes a touch switch tuning knob.

11. A receiver as in claim 10 where said resistor is varied in response to said tuning knob being touched and released.

* * * * *